(12) United States Patent
Nakamura et al.

(10) Patent No.: US 8,028,402 B2
(45) Date of Patent: Oct. 4, 2011

(54) CONNECTION BOARD, AND MULTI-LAYER WIRING BOARD, SUBSTRATE FOR SEMICONDUCTOR PACKAGE AND SEMICONDUCTOR PACKAGE USING CONNECTION BOARD, AND MANUFACTURING METHOD THEREOF

(75) Inventors: Hidehiro Nakamura, Tsukuba (JP); Akishi Nakaso, Oyama (JP); Shigeharu Arike, Nogi-machi (JP); Fumio Inoue, Tsukuba (JP); Tetsuya Enomoto, Tsukuba (JP); Norio Moriike, Shimodate (JP); Kousuke Hiroki, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 124 days.

(21) Appl. No.: 11/775,294

(22) Filed: Jul. 10, 2007

(65) Prior Publication Data

US 2008/0010819 A1 Jan. 17, 2008

Related U.S. Application Data

(62) Division of application No. 10/500,119, filed as application No. PCt/JP02/13434 on Dec. 24, 2002, now abandoned.

(30) Foreign Application Priority Data

Dec. 25, 2001 (JP) ................ P2001-391799
Apr. 26, 2002 (JP) ................ P2002-126594
Aug. 7, 2002 (JP) ................ P2002-230095

(51) Int. Cl.
*H05K 3/36* (2006.01)
*H01R 9/00* (2006.01)
*H01K 3/10* (2006.01)

(52) U.S. Cl. .............................. 29/830; 29/842; 29/852
(58) Field of Classification Search ............ 29/605–606, 29/830–832, 841–842, 854–855
See application file for complete search history.

(56) References Cited

U.S. PATENT DOCUMENTS 4,609,139 A * 9/1986 Hawrylo ................ 228/170
(Continued)

FOREIGN PATENT DOCUMENTS

JP 06-350258 12/1994
(Continued)

OTHER PUBLICATIONS

Office Action mailed Oct. 17, 2006 in JP 2003-557266.
(Continued)

*Primary Examiner* — A. Dexter Tugbang
*Assistant Examiner* — David Angwin
(74) *Attorney, Agent, or Firm* — Antonelli, Terry, Stout & Kraus, LLP.

(57) ABSTRACT

Disclosed is a manufacturing method of a multi-layer wiring board, which method includes: preparing connection boards, the connection boards having respectively an insulating resin composition layer, a connection conductor formed so as to pass through the insulating resin composition layer and a conductor circuit formed on the insulating resin composition layer and connected to the connection conductor; aligning the connection boards; and laminating the aligned connection boards by heating and pressing, so that the connection conductors, or the connection conductor and the conductor circuit, are conductively connected with each other, and the connection boards are mechanically connected with each other by the insulating resin composition layer. The connection boards are formed by specified processing, including use of a three-layer composite metallic layer.

6 Claims, 8 Drawing Sheets

U.S. PATENT DOCUMENTS

| | | | |
|---|---|---|---|
| 6,197,407 B1 * | 3/2001 | Andou et al. | 428/209 |
| 6,222,136 B1 * | 4/2001 | Appelt et al. | 174/254 |
| 6,239,983 B1 * | 5/2001 | Shingai et al. | 361/768 |
| 6,303,881 B1 * | 10/2001 | Parker et al. | 174/264 |
| 6,512,186 B1 * | 1/2003 | Nishiwaki et al. | 174/261 |
| 6,518,514 B2 | 2/2003 | Suzuki et al. | |
| 6,518,515 B2 * | 2/2003 | Nishii et al. | 174/262 |
| 6,806,174 B2 * | 10/2004 | Do | 438/589 |
| 7,160,609 B2 * | 1/2007 | Wakizaka et al. | 428/332 |

FOREIGN PATENT DOCUMENTS

| | | |
|---|---|---|
| JP | 11-251703 | 9/1999 |
| JP | 2000-101248 | 4/2000 |
| JP | 2000-286554 | 10/2000 |
| JP | 2001-015920 | 1/2001 |
| JP | 2001-036250 | 2/2001 |
| JP | 2001-326458 | 11/2001 |
| JP | 2001-326459 | 11/2001 |
| TW | 444529 | 9/1999 |

OTHER PUBLICATIONS

International Search Report mailed Apr. 15, 2003 for No. PCT/JP02/13434.

Hiroshi Ohira, et al., "Suggestion of Printed Wiring Board by New Manufacturing Method", A Collection of Papers at the Ninth Lecture Meeting Regarding Circuit Mount, ISSN 0916-0043, 15A-10, pp. 55-56, (Mar. 14-16, 1995).

Takahiro Mori, et al., "Application and Miniaturization of Substrate Using Inter-Layer Connection Technique Using Bump", A Collection of Papers at the Tenth Lecture Meeting Regarding Circuit Mount ISSN 0916-0043, 15A-09, pp. 79-80, (Mar. 13-15, 1996).

* cited by examiner

CONNECTION BOARD, AND MULTI-LAYER WIRING BOARD, SUBSTRATE FOR SEMICONDUCTOR PACKAGE AND SEMICONDUCTOR PACKAGE USING CONNECTION BOARD, AND MANUFACTURING METHOD THEREOF

This application is a Divisional application of prior application Ser. No. 10/500,119, filed Jun. 17, 2005 now abandoned, the contents of which are incorporated herein by reference in their entirety. Application Ser. No. 10/500,119 is a National Stage Application, filed under 35 USC 371, of prior International (PCT) Application No. PCT/JP02/13434, filed Dec. 24, 2002.

FIELD OF THE INVENTION

The present invention relates to a connection board, and a multi-layer wiring board, a substrate for semiconductor package, a semiconductor package using the connection board, and manufacturing method of them.

BACKGROUND OF THE INVENTION

Recently, the social environment surrounding us has been changing greatly according to an improvement in information communication network. Among such changes, the growth of mobile equipments is included. Their markets are being extended according to compactness and high functionality thereof. For this reason, further compactness of semiconductor package and multi-layer wiring substrate which is capable of mounting the package with high density are required. Further, inter-layer connection enabling high density wiring, i.e., technique for forming multiple layers with high density becomes important.

A through-hole connection that drilling and plating processes are combined is mainly provided as the method of forming plurality layers and widely known. According to this method, however, since holes are formed at all layers, a wiring capacity is limited.

In order to reduce the volume of holes at connecting portions, a build-up technique that processes of forming an insulating resin composition layer, drilling and forming a circuit are repeated has been mainly utilized. The build-up technique is roughly classified into a laser method and a photolithography method. According to the laser method, laser irradiation is performed in order to drill an insulating resin composition layer. On the other hand, according to the photolithography method, a photosensitive curing agent (photoinitiator) is used for insulating resin composition layer, a photo mask is placed thereon, exposure and development are performed for the layers and thus holes are formed.

Some inter-layer connection methods are proposed in order to obtain further reduction in costs and high density. Among such methods, a method capable of omitting processes of drilling and plating a conductive layer has attracted attention. According to this method, a bump is formed on a wiring of substrate by printing a conductive paste. Then, an inter-layer connection insulating material in a state of B stage and a metallic layer are disposed, the bump is inserted within a mold resin by pressing so as to be conductive connected to the metallic layer. This method that the bump is inserted is published in academic society and newspaper, and widely recognized in a field of printed wiring board (Hiroshi Ohira and two other persons, Suggestion of Printed Wiring Board by New Manufacturing Method, A Collection of Papers at the Ninth Lecture Meeting Regarding Circuit Mount, ISSN 0916-0043, 15A-10, PP. 55-56, (1995.3.14-16), Takahiro Mori and five other persons, Application and Miniaturization of Substrate Using Inter-Layer Connection Technique Using Bump, A Collection of Papers at the Tenth Lecture Meeting Regarding Circuit Mount, ISSN 0916-0043, 15A-09, pp. 79-80, (1996.3.13-15).

A device that plated wires are embedded into an elastomer such as silicon rubber in its thickness direction is developed and utilized as a convenient tool for connecting two conductors.

According to the laser method of the prior arts, a selection range of insulating materials is large, although drilling can be performed not only for adjacent layers but also for adjacent layers and next adjacent layers, there arise problems in that a de-smear treatment is required for removing foreign matters of resin diffused by laser irradiation and a working cost is increased in proportion to the number of holes.

According to the photolithography method, conventional facilities for manufacturing wiring board can be utilized and drilling can be performed at a time and thus a reduction in costs can be advantageously accomplished. Nevertheless, there arise problems in that the resolution of inter-layer insulating material and heat resistance, moreover strength of adhesion between a circuit and an insulating resin composition layer cannot be accomplished at the same time.

Further, since the bump is formed by printing a conductive paste or plating a metal, the precision of forming the bump relies on the limit of print technology. If the bump is formed by plating, there arises a problem that it is difficult to suppress height variation of bumps especially when diameters of holes are different. Further, the bump formed of conductive paste has small mechanical strength and may be broken by pressing pressure. The connection reliability may be decreased when a drilling process is required.

The method in which plated wires are embedded into an elastomer such as silicon rubber such that two layers of conductors are connected with each other is simple, but it is difficult to embed the wires only into desired connection positions. If the wires are embedded in a lattice configuration, the wires may become obstacles at positions that the wires are not desirably contacted.

SUMMARY OF THE INVENTION

The present invention was developed in the light of the above-described drawbacks and an object of the present invention is to provide a connection board that 1) inter-layer connection can be performed only at required positions without performing a drilling step, 2) a strong filled via structure can be formed, 3) a fine wiring circuit with excellent connection reliability can be formed, 4) high mechanical and thermal precision can be accomplished and 5) multiple layers can be formed by laminating them at a time, and a multi-layer wiring board, a substrate for semiconductor package and a semiconductor package using the connection board, and manufacturing methods of them.

Namely, the present invention is characterized by the followings.

(1) A connection board comprising an insulating resin composition layer formed of one layer or two or more layers and a connection conductor which is formed so as to pass through the insulating resin composition layer in its thickness direction at least at a position where a conductor circuit is connected.

(2) The connection board according to (1) further comprising a conductor circuit which is electrically connected to the connection conductor at least one surface of the connection board.

(3) The connection board according to (2), wherein the conductor circuit is a metallic layer.

(4) The connection board according to any one of (1) through (3), wherein an exposed portion of the connection conductor is covered with metal.

(5) The connection board according to any one of (1) through (4), wherein one of the insulating resin compositions placed at front and rear outermost layers of the connection board is or both of them are mainly made of thermoplastic resin.

(6) A manufacturing method of connection board comprising the steps of selectively removing a first metallic layer of composite metallic layer formed of, at least, second metallic layer serving as carrier and the first metallic layer with different removal condition from the second metallic layer to form a connection conductor; forming an insulating resin composition layer of one layer or two or more layers so as to cover at least side surfaces of the connection conductor; and polishing the insulating resin composition layer such that the connection conductor is exposed.

(7) The method of manufacturing connection board according to (6), wherein the composite metallic layer is formed of the first metallic layer, the second metallic layer and a third metallic layer which is disposed between the first metallic layer and the second metallic layer and has different removal condition from those of the first and second metallic layers, the first metallic is selectively removed so that the connection conductor is formed, and then the third metallic layer is selectively removed.

(8) The manufacturing method of connection board of (6) or (7), wherein a roughening treatment is performed for a surface of exposed second metallic layer at which the insulating resin composition layer is formed.

(9) The manufacturing of connection board according to any one of (6) through (8) further comprising a step of selectively removing the second metallic layer and forming the conductor circuit after polishing the insulating resin composition layer so that the connection conductor is exposed.

(10) The manufacturing method of connection board according to any one of (6) through (9) further comprising a step of additionally forming a conductor circuit on the exposed surface of the connection conductor and/or the surface of conductor circuit formed on the surface of the connection conductor after polishing the insulating resin composition layer so that the connection conductor is exposed.

(11) The manufacturing method of connection board according to any one of (6) through (10), wherein an adhesive sheet made of at least one insulating resin composition is mounted so as to cover the connection conductor, heated and pressed, and thus the insulating resin composition layer is formed.

(12) The manufacturing method of connection board according to any one of (6) through (11), wherein the side of composite metallic layer with the connection conductor being thereon at which the connection conductor is not formed is opposed to one side or both sides of supporting substrate which is larger than the corresponding side of composite metallic layer and has higher stiffness than the composite metallic layer and mounted thereon, predetermined manufacturing steps are performed for a resultant laminate and then the supporting substrate is removed therefrom.

(13) A multi-layer wiring board in which connection conductors or a connection conductor and conductor circuit of at least two connection boards obtained by being arbitrarily selected from connection boards according to any one of (1) through (5) are made into an alloy by solid phase metallic diffusion or melt bonding and conductive connected with each other, and the connection boards are mechanically connected with each other by an insulating resin composition.

(14) The multi-layer wiring board according to (13), wherein an insulating resin composition layer of the connection board is a liquid crystal polymer.

(15) A manufacturing method of multi-layer wiring board comprising the steps of: aligning at least two connection boards obtained by the manufacturing method of connection board according to any one of (6) through (12); and heating, pressing and laminating at a time the aligned connection boards, so that the connection conductors or the connection conductor and the conductor circuit are made into an alloy by solid phase metallic diffusion or melt bonding and conductive connected with each other, and the connection boards are mechanically connected with each other by an insulating resin composition.

(16) The manufacturing method of multi-layer wiring board according to (15), wherein a liquid crystal polymer is used for an insulating resin composition layer of the connection board.

(17) The manufacturing method of multi-layer wiring board according to (15) or (16) further comprising a step of forming an outer layer circuit after the step of heating, pressing and laminating at a time.

(18) The manufacturing method of multi-layer wiring board according to any one of (15) through (17), wherein a substrate having a conductor circuit and/or a metallic foil is laminated at a time together with the connection board.

(19) A substrate for semiconductor package manufactured by the multi-layer wiring board according to (13) or (14) or the multi-layer wiring board obtained by the manufacturing method according to any one of (15) through (18).

(20) The substrate for semiconductor package according to (19) comprising a cavity at a position where a semiconductor chip is mounted.

(21) A manufacturing method of substrate for semiconductor package comprising the manufacturing method of multi-layer wiring board according to any one of (15) through (18).

(22) The manufacturing method of substrate for semiconductor package according to (21) further comprising a step of forming a cavity at a position that a semiconductor chip is mounted.

(23) A semiconductor package manufactured by using the substrate for semiconductor package according to (19) or (20).

(24) A manufacturing method of semiconductor package comprising the manufacturing method of substrate for semiconductor package according to (21) or (22).

(25) The manufacturing method of semiconductor package according to (24) further comprising a step of connecting a semiconductor chip to a conductor circuit.

(26) The manufacturing method of semiconductor package according to (24) or (25) further comprising a step of sealing the semiconductor chip by a resin.

This application is based upon and claims the benefit of priority from the prior Japanese Patent Applications No. 2001-391799 (filed by the same applicant on Dec. 25, 2001), No. 2002-126594 (filed by the same applicant on Apr. 26, 2002) and No. 2002-230095 (filed by the same applicant on Aug. 7, 2002), the entire contents of which are incorporated by reference.

BRIEF DESCRIPTION OF DRAWINGS

FIGS. 8(*a*) and (*b*) are cross-sectional views of step of manufacturing sample for measuring connection resistance used in Example 4 of the present invention.

DETAILED DESCRIPTION OF THE PREFERRED EMBODIMENTS

Figure 1:
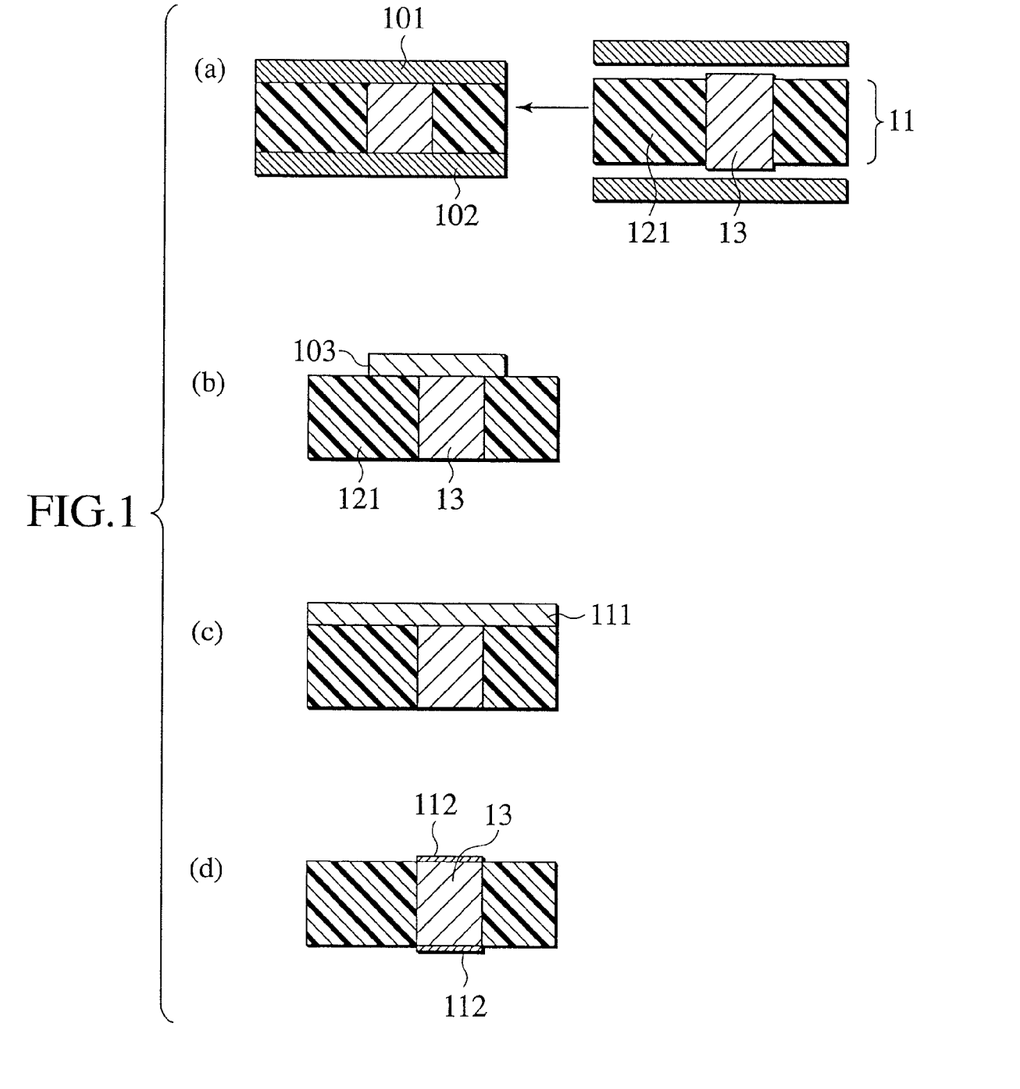
FIG. 1 is a cross-sectional view for explaining an embodiment of the present invention.

A connection board 11 of the present invention is, for example, as shown in FIG. 1(*a*), a board for connecting metallic foils 101 and 102 and comprises an insulating resin composition layer 121 and a connection conductor 13. The connection conductor 13 is formed so as to pass through the insulating resin composition layer 121 in its thickness direction at least at a position where a conductor circuit is connected. Further, the connection conductor 13 is exposed from at least one surface of the insulating resin composition layer 121. The connection conductor 13 may be protruded from the surface of the insulating resin composition layer 121 or may be embedded into the insulating resin composition layer 121 from its surface. In the former case, the connection conductor 13 may be protruded in such a manner that the insulating resin composition layer 121 is polished to be flat and then a metallic layer 112 is newly added. In the latter case, for example, etch back using etchant of copper may be performed.

As shown in FIG. 1(*b*), the connection board of the present invention may have a conductor circuit 103 at one surface of the insulating resin composition layer 121. The conductor circuit 103 may be a metallic layer 111 as shown in FIG. 1(*c*). As shown in FIG. 1(*d*), both surfaces of the connection conductor 13 including exposed portions are preferably covered with metallic layers 112. Examples of such metal include metals such as copper, indium, zinc, lead, gold, platinum, nickel, palladium, tin, alloys containing at least one type of such metals and metallic layer of two or more layers. When a conductor circuit made of two or more layers is connected, it is desirable from a view of improving connection reliability between metals that these layers are subjected to solid phase metallic diffusion and made into an alloy at an interface therebetween or that these layers are melt-bonded with each other at a temperature which is equal to or lower than a heating temperature at a time of heating, pressing and laminating at a time.

An embodiment of manufacturing method for connection board of the present invention will be described hereinafter with reference to FIG. 2.

Figure 2:
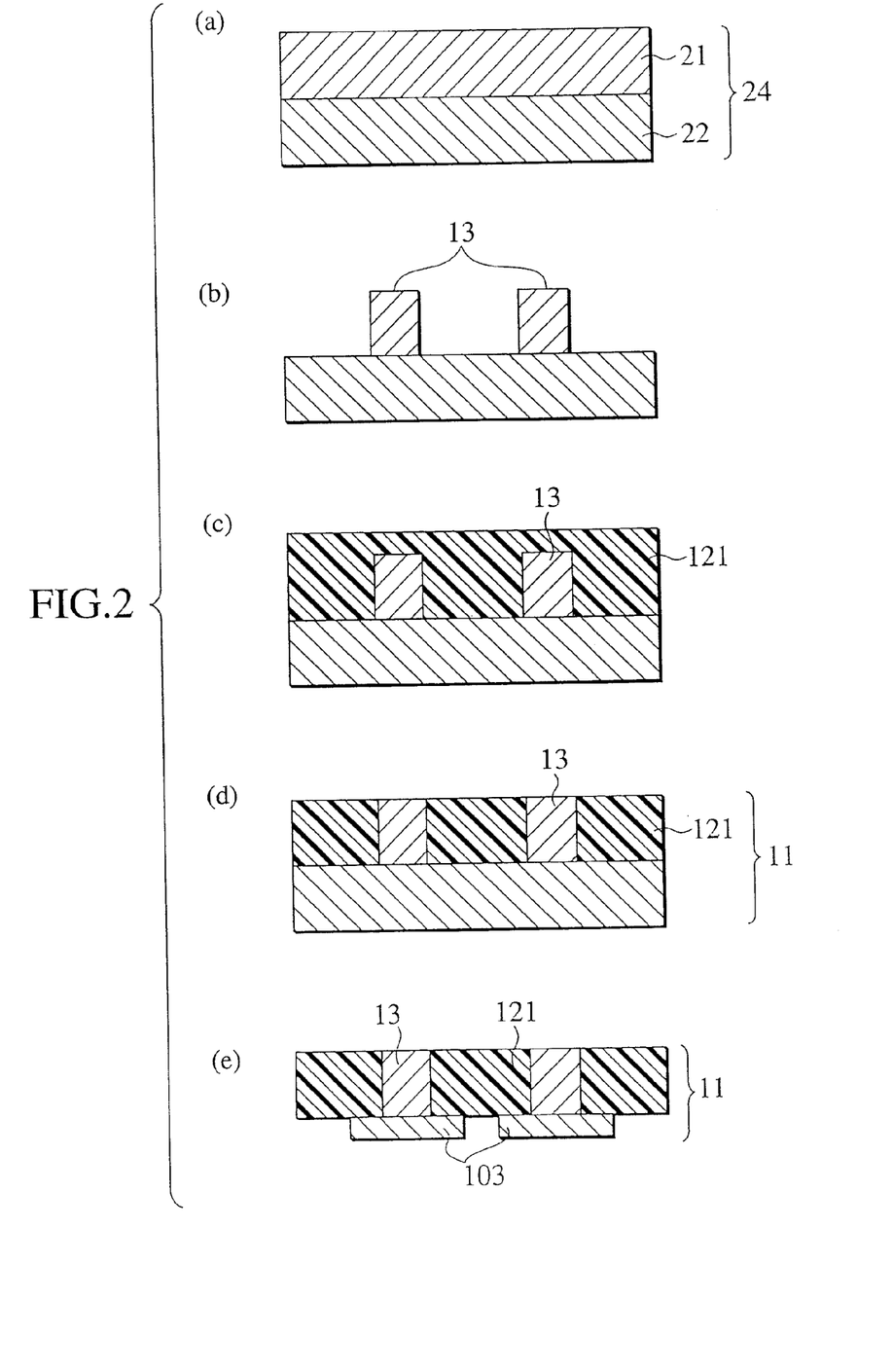
FIG. 2 is a cross-sectional view showing an embodiment of manufacturing method for connection board of the present invention.

A composite metallic layer 24 (FIG. 2(*a*)) is formed of first metallic layer 21 serving as a connection conductor and second metallic layer 22 with different removal condition from the first metallic layer 21. The first metallic layer 21 is selectively removed and thus the connection conductor 13 is formed (FIG. 2(*b*)).

A thickness of the first metallic layer 21 is desirably thicker than that of desired insulating layer because the connection conductor 13 is formed. Although the thickness must be determined depending on an amount that the first metallic layer 21 is polished and removed in the next step for polishing the insulating resin composition layer 121, the thickness is preferably in a range of 5 to 100 µm. If the thickness is smaller than 5 µm, a distance to conductor circuit to be connected becomes small and insulating property may be deteriorated. If the thickness exceeds 100 µm, it is not preferable because the precision of working is decreased at a time of removing by etching unnecessary portions of metallic foil. More preferably, the thickness is in a range of 20 to 80 µm.

A thickness of the second metallic layer 22 is preferably in a range of 5 to 100 µm. If the thickness is smaller than 5 µm, a mechanical strength of the second metallic layer 22 is decreased and thus easily bent when the first metallic layer 21 is selectively removed by etching. If the thickness exceeds 100 µm, it takes a long time to remove later the second metallic layer 22, which is not economical. The thickness is preferably in a range of 10 to 80 µm.

The connection conductor is not especially limited and may be formed by selectively removing unnecessary portions of metallic foil such as copper foil as described above or may be formed, by metal plating, on a metallic foil with different removal condition in a configuration of the connection conductor. A thickness of the connection conductor is preferably in a range of 5 to 100 µm. If the thickness is smaller than 5 µm, an inter-layer distance to conductor circuit to be connected becomes small and insulating property may be inferior. If the thickness exceeds 100 µm, it is not preferable because precision of working when unnecessary portions of metallic foil are removed by etching is decreased. More preferably, the thickness is in a range of 20 to 80 µm.

Next, the insulating resin composition layer 121 is formed so as to cover the connection conductor 13 (FIG. 2(*c*)).

The insulating resin composition layer refers to as a layer that a composition comprising an insulating resin such as thermosetting resin, photo-curing resin, thermoplastic resin is semi-cured and/or cured.

As the aforementioned thermosetting resin, there may be used thermosetting resins prepared such that at least one resin selected from a group of epoxy resin, bismaleimide-triazine resin, polyimide resin, cyanoacrylate resin, phenol resin, unsaturated polyester resin, melamine resin, urea resin, polyisocyanate resin, furan resin, resorcinol resin, xylene resin, benzguanamine resin, diallylphthalate resin, silicone-modified epoxy resin, silicone-modified polyamidimide resin and benzcychlobutene resin is mixed with, if necessary, curing agent or curing accelerator therefor and a resultant mixture is heated so as to be in a semi-cured state or a cured state.

As the aforementioned photo-curing resin, for example, there may be used photo-curing resins prepared such that at least one resin selected from a group of unsaturated polyester resin, polyesteracrylate resin, urethanacrylate resin, siliconacrylate resin and epoxyacrylate resin is mixed with, if necessary, photo-initiator, curing agent or curing accelerator therefor and a resultant mixture is heated so as to be in a semi-cured state or a cured state.

As the aforementioned thermoplastic resin, for example, there may be used thermoplastic resins prepared such that at least one resin selected from a group of polycarbonate resin, polysulphone resin, polyetherimide resin, thermoplastic polyimide resin, tetrafluoropolyethylene resin, hexafluoropolypropylene resin, polyetheretherketone resin, vinyl chloride resin, polyethylene resin, polyamidimide resin, polyphenylensulfide resin, polyoxybenzate resin, aromatic polyester resin and liquid crystal. Furthermore, what is made into the shape of a film can be used by heating, forming and cooling at least one above-mentioned thermoplastic resin.

The aforementioned insulating resin may be used alone or a mixed body of different kinds of insulating resins may be used for the insulating resin composition layer of connection board of the present invention. Further, an insulating resin containing an inorganic filler as a filler may be used. The inorganic filler is not especially limited and conventionally known inorganic fillers may be used. Examples of the inorganic filler include a conductive particle of nickel, gold or sliver, silica, metal oxide or a resin particle with such materials being metal-plated thereon. In order to maintain an insulation of insulating resin composition, a non-conductive filler is used desirably.

It is preferable that the insulating resin composition used for the present invention contains a thermoplastic resin because a resin needs not to be newly applied to a substrate surface at a time of forming a plurality of layers. More preferably, the insulating resin composition used for the present invention is an insulating resin composition containing a liquid crystal polymer serving as a thermoplastic resin. If the insulating resin composition containing a liquid crystal polymer is used, its linear expansion coefficient can be made to be closer to that of copper. Thus, it is effective in view of laminating at a time the insulating resin composition together with connection of connection conductor. A liquid crystal polymer used for the present invention preferably has 180° C. or higher of phase transition temperature from smectic phase to nematic phase. A liquid crystal polymer with 280° C. or higher of the phase transition temperature is more preferably because it can withstand a reflow treatment temperature for lead-less soldering. Specific examples of liquid crystal polymer include Xydar SRT-300, SRT-500, FSR-315, RC-210, FC-110, FC-120, FC-130 (trade names manufactured by Nippon Petrochemicals Co., Ltd.), ECONOL E2000 (trade name manufactured by Sumitomo Chemical Co., Ltd.) series, ECONOL E6000 (trade name manufactured by Sumitomo Chemical Co., Ltd.) series, VECTRA 950, VECTRA A130, VECTRA C130, VECTRA A230, VECTRA A410 (trade names manufactured by Polyplastics Co., Ltd.), EPE-240G30 (trade name manufactured by Mitsubishi Kasei Co., Ltd.), RODRUN LC-5000H (trade name manufactured by Unitika Co., Ltd.), NOVACCRRATE E322G30, E335G30, EPE-240G30 (trade names manufactured by Mitsubishi Chemical Co., Ltd.) and BIAC (trade names manufactured by Japan Gore-Tex Inc.).

An insulating resin composition may be directly applied on a substrate surface with a connection conductor being formed thereat. Alternatively, an insulating resin composition may be applied to a surface of plastic film such as polyethylene terephthalate film or metallic foil such as copper foil, aluminum foil or the like, serving as a carrier. Then, a resultant film is heated and dried so as to produce a dry film adhesive sheet. The adhesive sheet is cut with required size and laminated or pressed on the substrate with the connection conductor being formed thereat. In this way, the insulating resin composition layer may be formed.

A thickness of the insulating resin composition layer is preferably in a range of 1 to 100 µm. If the thickness is smaller than 1 µm, it is difficult to form the insulating resin composition with uniform thickness not so as its adhesive strength is decreased. If the thickness exceeds 100 µm, it becomes disadvantageous when making the connection baord into a thin shape. More preferably, the thickness is in a range of 3 to 70 µm.

If air bubbles are contained in the insulating resin composition layer covering the connection conductor, it is not preferable in view of connection reliability. Thus, it is more preferable to prevent the air bubbles from existing in the insulating resin composition layer.

Figure 3:
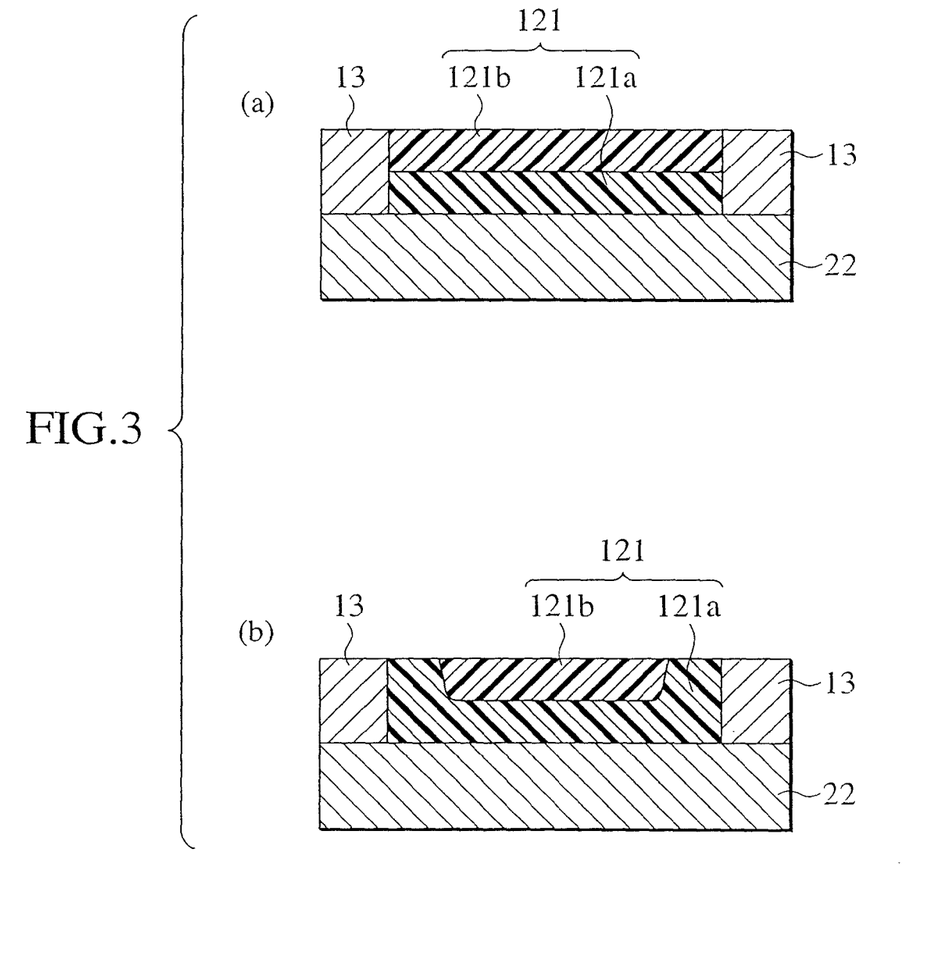
FIG. 3 is a cross-sectional view showing the embodiment of the present invention.

The insulating resin composition layer may be formed of one layer or two or more layers. Nevertheless, it is preferable to form two or more layers because thermal stress generated at a substrate surface in pressing and polishing steps can be reduced and warpage of connection board can be also reduced. If the insulating resin composition layer formed of two or more layers, for example, of two layers is formed, as shown in FIG. 3(a), side surfaces of insulating resin composition layers 121a and 121b forming the insulating resin composition layer 121 may oppose a side surface of the connection conductor 13. Alternatively, as shown in FIG. 3(b), only the side surface of the insulating resin composition layer 121a may oppose the side surface of the connection conductor 13. If the insulating resin composition with two or more layers is formed, types of insulating resin composition to be used are preferably distinguished by hardness of resin after molding, thickness of resin after molding, difference of molecular orientation, presence or absence of filler, type of filler or its content, average particle diameter of filler, particle shape of filler, specific gravity of filler. If a liquid crystal polymer is used when the insulating resin composition layer is formed into a multi-layer structure, as described above, the liquid crystal polymer may be used alone by utilizing its characteristic that it easily forms a multi-layer structure itself on a basis of molecular orientation at a time of being formed and thus a multi-layer structure can be provided.

It is preferable to perform a roughening treatment for a surface of exposed second metallic layer prior to forming of insulating resin composition layer in view of improving a strength of close contact to the insulating resin composition.

Then, the insulating resin composition layer 121 formed by the above-described manner is polished such that the connection conductor 13 is exposed. Thus, the connection board of the present invention that the connection conductor is formed so as to pass through the insulating resin composition layer in its thickness direction can be obtained (FIG. 2(d)). Further, by selectively removing the second metallic layer 22 shown in FIG. 2(d), the connection board with the conductor circuit 103 shown in FIG. 2(e) can be obtained.

According to the present invention, it is important that the connection conductor is formed so as to pass through the insulating resin composition layer in its thickness direction at least at a position where the conductor circuit is connected. Among conventional arts, according to connection tool that wires are embedded into an elastomer, wires are embedded at equal intervals therebetween. Thus, even if a conductor circuit of two layers for connection is shifted a little, connection cannot be performed or connection may be performed at unexpected position. Consequently, it is difficult to connect a fine conductor circuit with high precision. On the other hand, according to the present invention, a connection conductor cannot be formed at unexpected position and thus a fine circuit can be formed with high precision.

A metallic foil may be further applied on a surface of connection conductor exposed by polishing the insulating resin composition layer 121 and/or on a surface of conductor circuit formed on a surface of the connection conductor. Alternatively, a treatment such as a metal plating or an etching may be performed for such surfaces. In this way, a conductor circuit can be added or a metallic film can be applied. The metallic film can be formed by, for example, a method of performing electroless copper plating subsequent to application of palladium, a vacuum film forming method such as copper sputtering or copper sputtering with chromium being a base, print of metallic paste such as silver paste, substituted or electroless gold plating, electrolysis or electroless plating of nickel/gold, electrolysis or electroless plating of nickel/palladium/gold or electrolysis or electroless plating of tin or tin alloy.

Moreover, a protruded conductor referred to as a bump may be formed on the conductor circuit connected to the connection conductor. In order to form the bump on the connection board of the present invention, half etching is performed in a thickness direction for a portion of relatively thick conductor other than the protruded portion, so that the protruded portion is formed. Then, other portions are removed by etching so that thinned conductor circuit portion and the protruded portion are left. Alternatively, after the circuit is formed, only portions of connection terminals are made to be thick by plating.

Figure 4:
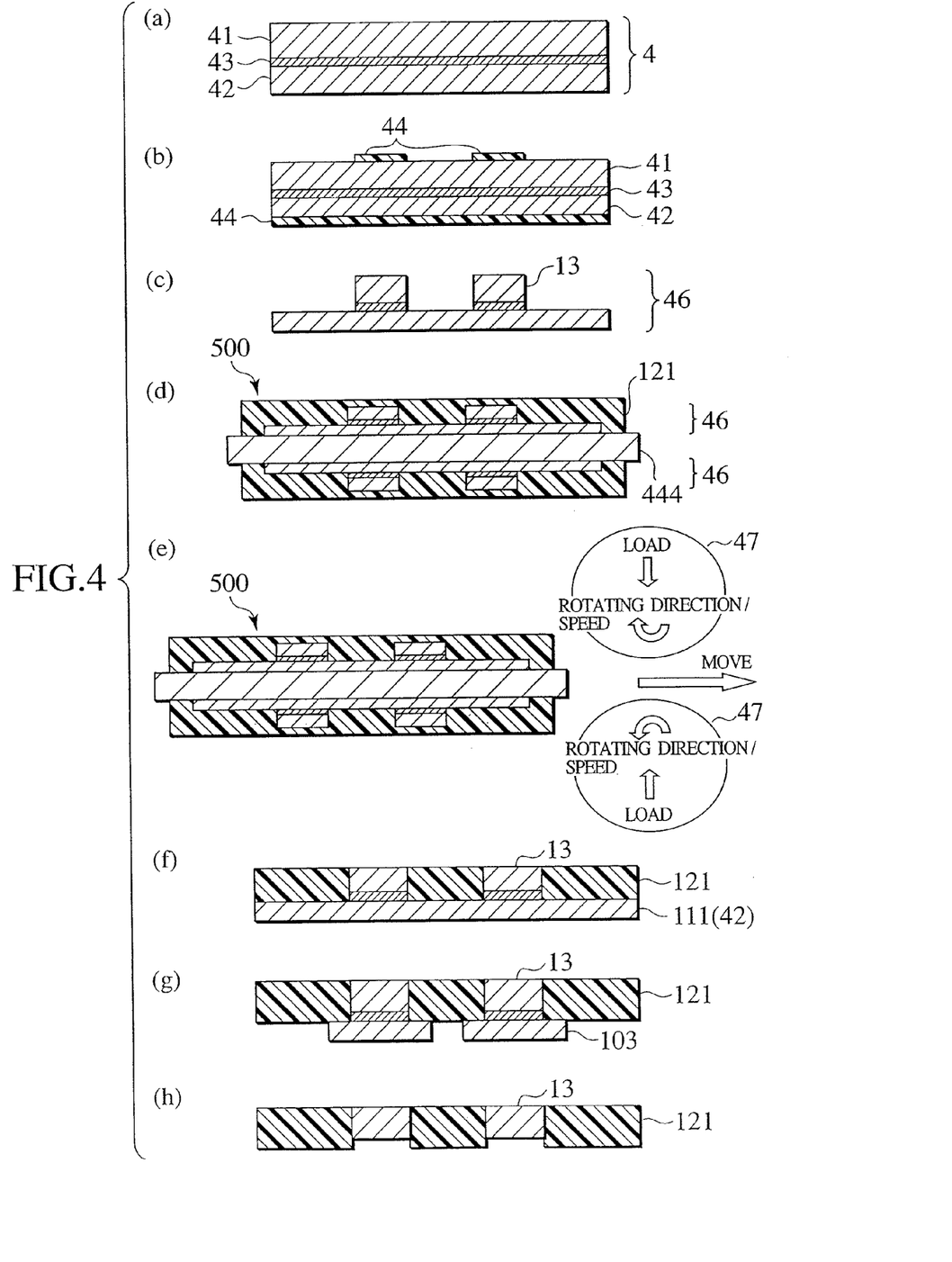
FIG. 4 is a cross-sectional view showing an embodiment of manufacturing method for connection board of the present invention.

Although the connection board of the present invention is produced by using a composite metallic layer formed of two layers, as the composite metallic layer used for the present invention, a composite metallic layer 4 formed of three layers as shown in FIG. 4(a) is preferably used from an economical point of view.

This is because copper is preferably used for the first metallic layer from an economical point of view and it is considered to use nickel or its alloy for the second metallic layer with different etching removal condition from copper. Nevertheless, nickel or its alloy is more expensive than copper. When the composite metallic layer is formed of two layers, high mechanical strength is required for the second metallic layer serving as a support for the connection conductor which is formed from the first metallic layer. Thus, a certain thickness is required for the second metallic layer and a large amount of expensive metal must be used. According to the composite metallic layer with three layers that is obtained by forming an expensive metallic layer with different etching removal condition from the first and the second metallic layers so as to be relatively thin between the first metallic layer and the second metallic layer, the second metallic layer may be made of copper as the first metallic layer. Consequently, it is economical and excellent mechanical strength can be provided.

A thickness of the third metallic layer in such composite metallic layer formed of three layers is as small as possible and is preferably in a range of 0.05 to 5 μm. If the thickness is smaller than 0.05 μm, when deposition defects are generated at a plated film for forming a layer of nickel or its alloy, because of its small thickness, such defects are not thoroughly covered by the plated film. Thus, so-called pits (lack of plating) are generated. When the first metallic layer is removed by etching, the second metallic layer may be eroded, an etchant may be left, and thus reliability of connection may be decreased. If the thickness exceeds 5 μm, the problems are not presented in steps, but the cost for materials may be increased, which is not economical. Thicknesses of the first and the second metallic layers of the composite metallic layer with three layers are the same as in the case of the above-described composite metallic layer formed of two layers.

A method for efficient manufacturing the connection board of the present invention by using the composite metallic layer 4 with three layers will be described hereinafter.

Firstly, the composite metallic layer 4 formed of the first metallic layer 41, the second metallic layer 42 and the third metallic layer 43 is prepared as shown in FIG. 4(a). Then, as shown in FIG. 4(b), an etching resist 44 is formed a shape of the connection conductor 13 by lamination of resist film on the surface of the first metallic layer 41, and then by exposing to light and developing. A rear surface is protected by laminating the etching resist 44 entirely on the rear surface and exposing the same to light. Then, the first metallic layer 41 is selectively removed by etching. After the resist 44 is removed, the third metallic layer is subsequently removed by etching. As a result, a composite metallic layer 46 with the connection conductor 13 being formed thereat can be obtained (FIG. 4(c)). When a plurality of circuits are formed on the composite metallic layer 46, a larger quantity of connection boards can be produced more efficiently.

A surface of the composite metallic layer 46 at which the connection conductor 13 is not formed opposes a surface of supporting substrate 444 which has larger stiffness and area than those of the composite metallic layer 46 with the connection conductor being formed thereon, and is placed thereon. Alternatively, a plurality of the composite metallic layer 46 may oppose both surfaces of the supporting substrate 444 and be placed thereon. Further, an adhesive sheet that is made of insulating resin composition and larger than the composite metallic layer 46 is placed on the connection conductor 13. A resultant laminate is heated and pressed from both sides and thus an insulating resin composition layer 121 is formed (FIG. 4(d)). Thereafter, the insulating resin composition layer 121 is polished (FIG. 4(e)) such that the surface of the connection conductor 13 is exposed and then predetermined steps are performed. Then, a resultant layer is cut into a sheet with predetermined size and removed from the supporting substrate 444. In this way, the connection board is obtained (FIG. 4(f)). The predetermined steps include general steps required for forming a conductor circuit, such as a step of forming a metallic film on an exposed surface of the connection conductor 13 by plating or sputtering and a step of etching the metallic film.

The connection board obtained by performing the above-described steps is not limited to the configuration shown in FIG. 4(f) and if necessary, connection boards with various configurations can be obtained. For example, after the second metallic layer 42 of FIG. 4(f) is selectively removed, the conductor circuit 103 may be formed (FIG. 4(g)). Alternatively, after the entire second metallic layer 42 is removed, the exposed third metallic layer 43 may be removed (FIG. 4(h)). If the conductor circuit 103 is formed, the third metallic layer 43 applied to portions that the conductor circuit 103 is not formed may be removed.

It is efficient and preferable to form the insulating resin composition layer by using an adhesive sheet made of insulating resin composition. A plurality of the same type or different types of sheets may be laminated and used.

Since the composite metallic layer 46 is not adhered to the supporting substrate 444, the connection board can be easily removed from the substrate 444 by being cut into a predetermined size. Thus, it is possible to efficiently manufacture the connection board.

The multi-layer wiring board of the present invention can be obtained in such a manner that among connection boards obtained by the above-described manner, two or more connection boards are aligned, heated, pressed and laminated at a time. Further, the substrate with the conductor circuit and/or metallic foil may be laminated at a time together with the connection board of the present invention and thus the multi-layer wiring board of the present invention can be formed.

The multi-layer wiring board of the present invention is characterized in that corresponding conductor circuits of opposing connection board, corresponding connection conductor and corresponding conductor circuit or corresponding connection conductors are made into an alloy by solid phase metallic diffusion or melt-bonding and thus are conduct with each other and contact surfaces other than contact surfaces of the corresponding conductor circuits, the corresponding connection conductor and the corresponding conductor circuit or the corresponding connection conductors are mechanically connected by the insulating resin composition. The state of "being mechanically connected" refers to as a state of being connected by adhesion and that a mechanical external force is required for removal. The mechanical connection is used herein so as to be distinguished from electric connection, i.e., conductive connection. In opposing connection boards, contact surfaces other than contact surfaces of the corresponding conductor circuits, the corresponding connection conductor and the corresponding conductor circuit or the corresponding connection conductors include contact surfaces of insulating resin composition layers, insulating resin composition layer and connection conductor and insulating resin composition layer and conductor circuit.

Figure 5:
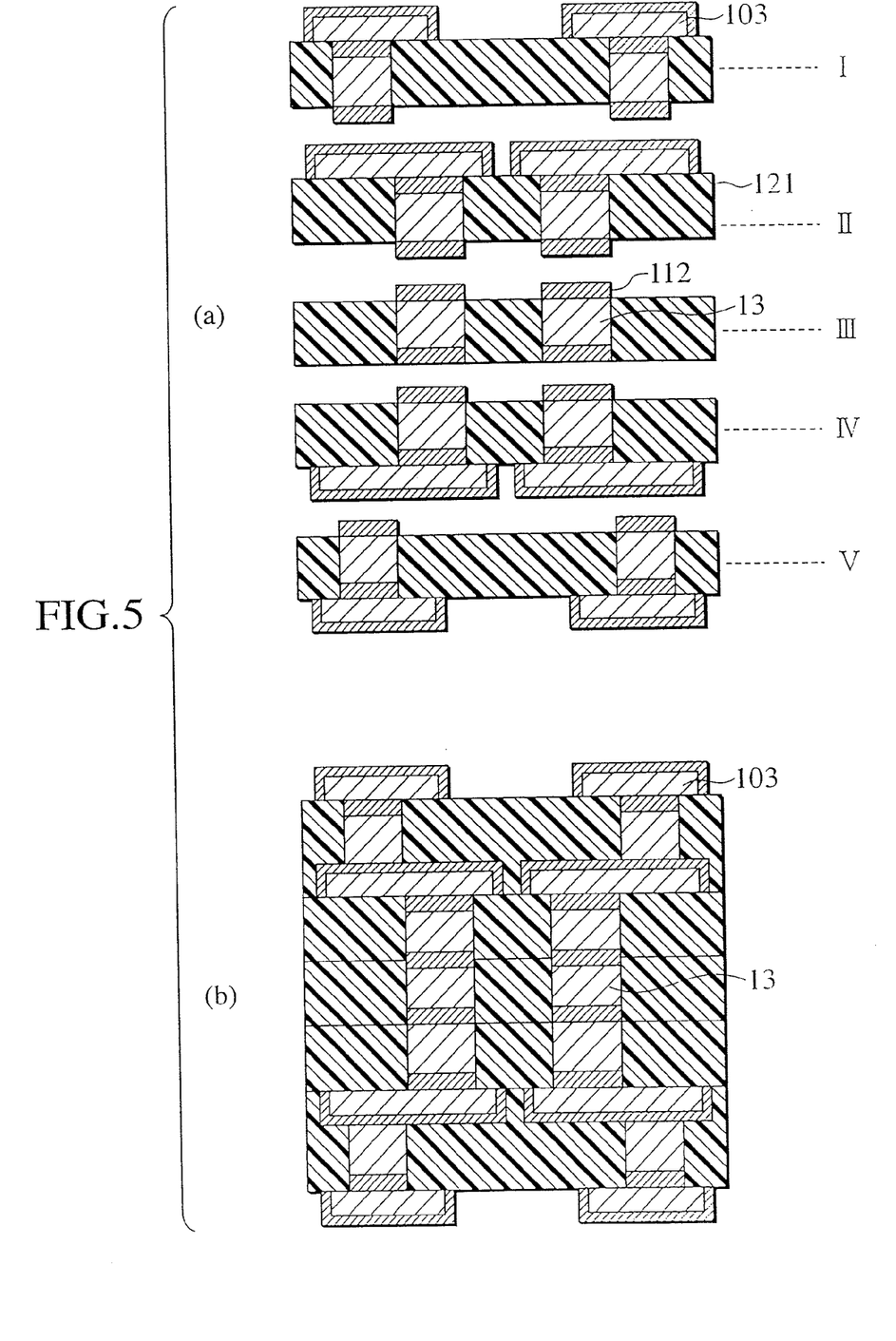
FIG. 5 is a cross-sectional view showing a process of laminating at a time connection boards of the present invention so as to manufacture a multi-layer wiring board.

At a time of laminating at a time, for example, as shown in FIG. 5(a), a connection conductor 13 of connection board I or V and a connection conductor 13 of connection board II or IV are not on a line extended in a direction of passing through the connection board and thus a crank structure may be provided. In this case, the conductor circuit may be deformed and stability of connection resistance may be deteriorated. Thus, it is preferable to use an insulating resin composition with high modulus of elasticity for insulating resin composition layers 121 of the connection board II, III and IV at an interior side of multi-layer wiring board. If the insulating resin composition layer 121 is made of two or more layers, a resin layer contacting the conductor circuit desirably has high modulus of elasticity. For example, referring to FIGS. 3(a) and 3(b), the insulating resin composition layer 121a has high modulus of elasticity. Specific value of modulus of elasticity is preferably equal to or larger than 0.0001 GPa at a heating temperature, and is more preferably equal to or larger than 0.001 Gpa, and is especially preferably equal to or larger than 0.01 GPa. A dynamic modulus of elasticity of insulating resin composition can be measured by using ARES manufactured by Rheometric Scientific FE. Ltd. (parallel plates, a frequency of 1 Hz, a temperature is increased at a rate of 5° C./min.).

An insulating resin composition containing a thermoplastic resin is preferably used for the insulating resin composition layer serving as an outermost layer of connection board, and more preferably an insulating resin composition containing a liquid crystal polymer is used. Further, subsequent to lamination at a time, an outer layer circuit may be formed on the outermost layer of multi-layer wiring board by plating or etching.

A substrate for semiconductor package of the present invention is manufactured by using the above-described connection board or multi-layer wiring board. Further, the substrate for semiconductor package of the present invention may have a cavity at which a semiconductor chip is mounted.

A manufacturing method for such substrate for semiconductor package includes the manufacturing method of the above-described connection board or multi-layer wiring board. Further, a step of forming a cavity that a semiconductor chip is mounted may be provided after the step of heating, pressing and laminating at a time.

A semiconductor package of the present invention is manufactured by using the above-described connection board, multi-layer wiring board or substrate for semiconductor package. For this reason, a manufacturing method of the semiconductor package may include the manufacturing method of the above-described connection board, multi-layer wiring board or substrate for semiconductor package. Further, steps of mounting a semiconductor chip and connecting the semiconductor chip to an outer layer conductor circuit may be provided. Moreover, a step of sealing the semiconductor chip by resin may be provided.

At a time of mounting a semiconductor chip, a substrate for semiconductor package is usually heated from its bottom portion a t a temperature of about 200° C. Then, the substrate may be curved because of this heating. The chip may be floated and thus a wire bonding step may be difficult. This is caused by a difference between a thermal expansion coefficient of insulating resin composition and that of wiring layer. For this reason, it is important to make a thermal expansion coefficient of the insulating resin composition be close to that of wiring layer made of copper, i.e., about 18 ppm/° C. If a thermosetting resin is used for the insulating resin composition layer for connection board, a curved substrate is returned to its original state after a semiconductor chip is mounted. If a thermoplastic resin is used for the insulating resin composition layer, however, thermal distortion remains because of incline within the thermoplastic resin and the substrate is not returned to its original state after a semiconductor chip is mounted and remains curved. Accordingly, when a thermoplastic resin is used in the present invention, as described above, an insulating resin composition layer with two or more layers is preferably formed. Further, when an adhesive sheet is used, a plurality of sheets with different thicknesses are preferably laminated so as to form an insulating resin composition layer. For example, an adhesive sheet with a thickness of 50 μm and an adhesive sheet with a thickness of 25 μm are successively laminated with each other so as to form an insulating resin composition layer. When the amount of polished resin is 20 μm, an unpolished layer with a thickness of 50 μm and a layer with a thickness of 5 μm remained as a result of polishing exist at a core portion of base material. The layer of 5 μm affects generation of curve, but the layer of 50 μm does not affect such generation. Consequently, warpage does not occur at a time of mounting a semiconductor chip. In order to obtain such structure, three sheets each of which has a thickness of 25 μm may be pressed.

Example 1

As shown in FIG. 4(a), a composite metallic layer 4 formed of 70 μm of first metallic layer 41 made of copper, 0.2 μm of third metallic layer 43 made of nickel and 35 μm of second metallic layer 42 made of copper was prepared. As shown in FIG. 4(b), a resist NCP225 or NIT225 (trade name manufactured by Nichigo-Morton Co., Ltd.) serving as an etching resist 44 was laminated on a surface of the first metallic layer 41 under conditions such as 110° C. of roll temperature and 0.6 m/min. of roll speed, formed under exposure conditions such as 80 mJ/cm$^2$ of accumulated exposure amount, developed with sodium carbonate solution and subjected to post-exposure in order to ensure close contact of the resist. A rear surface is completely protected by laminating the etching resist 44 and exposing it on the same conditions as the above.

Then, an alkaline etching A process solution (trade name manufactured by Meltex Inc.) serving as an etchant which did not erode nickel was sprayed on the first metallic layer 41 and then the first metallic layer 41 was selectively removed by etching. In this way, the connection conductor 13 was formed. Operational conditions at this time were adjusted such that a density of copper was in a range of 135 to 145 g/l, a density of chlorine was 145 to 170 g/l, a density of ammonium was in a range of 8.0 to 9.2N, a pH was in a range of 8.1 to 8.5 and a specific gravity was in a range of 1.2 to 1.215. A temperature was 50° C. and a spray pressure from above and below was in a range of 0.9 to 1.5 kg/cm$^2$. Such conditions were determined such that conditions that a nickel layer serving as the third metallic layer 43 was exposed at all portions other than the connection conductor were optimized while adjusting a speed of conveyer and changing a spray time. Then, the etching resist 44 was removed by sodium hydrate solution. The nickel layer serving as the third metallic layer 43 was selectively removed by etching by using MELSTRIP N950 (trade name manufactured by Meltex Inc.) and thus a copper layer serving as the second metallic layer 42 was exposed. Operational conditions at that time were as follows. 500 ml/l of N-950A of MELSTRIP, 100 ml/l of N-950B of MELSTRIP, 100 ml/l of 30% aqueous hydrogen peroxide solution and remaining amount of water were mixed together and suspended. A resultant solution was heated to 40° C. and applied for each batch or sprayed (from above and below in a range of 0.9 to 1.5 kg/cm$^2$). In this way, the nickel layer serving as the third metallic layer 43 was selectively removed by etching. Then, a surface treatment solution CZ8100 (manufactured by Mec Co., Ltd.) was sprayed onto an exposed surface and a roughening treatment was performed upon the exposed copper surface. As a result, as shown in FIG. 4(c), the composite metallic layer 46 with the connection conductor 13 being formed thereon was obtained.

Next, the composite metallic layer 46 was mounted on both surfaces of supporting substrate 444 which has a thickness of about 0.5 mm and larger stiffness and area than those of the composite metallic layer 46 such that the connection conductor 13 is placed at the outside. At that time, the composite metallic layers 46 were mounted on the both sides of the supporting substrate 444 at the same positions. This aligning was carried out as follows. Namely, guide holes were formed in advance at the supporting substrate 444 and predetermined positions of the composite metallic layers 46 that were to be mounted on its both sides. Then, guide pins were passed through the guide holes, so that aligning was performed. Thereafter, corners of the composite metallic layers 46 and the supporting substrate 444 were fixed by a myler tape or a polyimide tape and the guide pins were removed from the guide holes. Examples of effectively used supporting substrate 444 include 1) a simple substance of copper or SUS, 2) a substrate produced by forming a metallic layer on a surface of base material of polyimide or TEFLON (registered trademark of E.I. Dupont de Nemours and Company), 3) a substrate produced by forming polyimide or TEFLON (registered trademark of E.I. Dupont de Nemours and Company) on a surface of core base material of copper or SUS. Then, first 50 μm and next 25 μm of liquid crystal polymers BIAC (manufactured by Japan Gore-Tex Inc.) serving as adhesive sheets of insulating resin composition were mounted in that order so as to cover the entire composite metallic layers 46 mounted on the both sides of the supporting substrate 444. Further, a polyimide film (manufactured by Ube Industries, Ltd.) was placed so as to cover the adhesive sheet for releasing. Then, a resultant laminate was heated and pressed from its both sides at a temperature of 333° C. and a pressure of 4 MPa for 5 minutes, the releasing film was peeled by the hand and thus a structure 500 shown in FIG. 4(d) was obtained.

As shown in FIG. 4(e), surfaces of the structure 500 were polished at both sides by roll polishing. At that time, a rotating speed of polishing rolls 47 and a load applied at an interval between the rolls were adjusted. Polishing was repeated for four or five times under a condition that 4 μm of thickness was reduced for each polishing and thus an entire surface of the connection conductor was exposed. Namely, an amount of polishing was about 20 μm for each surface of the structure 500. After polishing, end portions of the supporting substrate were cut and the connection board was removed from an interface of the supporting substrate. If the connection board can be removed from the interface of the supporting substrate without cutting the end portions, the supporting substrate can be repeatedly used and thus a production efficiency is improved. In a case of substrate produced by forming polyimide or TEFLON on a surface of core base material made of copper or SUS, the connection bard could be removed without cutting end portions of the substrate. On the other hand, in cases of substrate produced by forming a metallic layer on a surface of base material made of polyimide or TEFLON (registered trademark of E.I. Dupont de Nemours and Company) and substrate produced by a simple substance of copper or SUS, the connection board could not be removed from the interface. Nevertheless, the composite metallic layer could be cut at a portion that the supporting substrate did not contact an insulating resin. Thus, as shown in FIG. 4(f), a connection board that was conducted to a metallic layer and included a connection conductor therein could be obtained. It was confirmed that productivity was significantly improved.

Thereafter, the second metallic layer 42 was removed by etching and thus a connection board that had the conductor circuit 103 and contained the connection conductor 13 therein as shown in FIG. 4(g) could be obtained. Further, after the second metallic layer 42 was entirely removed, the third metallic layer 43 was removed and thus a connection board with the connection conductor 13 being built therein as shown in FIG. 4(h) could be obtained.

Referring to FIGS. 4(f), 4(g) and 4(h), the insulating resin composition layer was formed by using 50 μm and 25 μm of two layers of liquid crystal polymer BIAC. A connection board which had substantially the same configuration as in the case of two layers could be obtained by using 75 μm of liquid crystal polymer.

Example 2

Electroless nickel plating, electroless palladium plating and electroless gold plating were successively performed upon surfaces of various connection boards obtained in Example 1. Then, the connection boards subjected to plating treatment were aligned as shown in FIG. 5(a) by guide pins and laminated at a time by pressing again at 333° C. In this way, a multi-layer wiring board shown in FIG. 5(b) was produced and its conductive connection by alloy of gold and gold was confirmed. At that time, an insulating resin composition between the connection boards was melted again and adhered with each other. When either of substitution type electroless tin plating and reduction type electroless tin plating was utilized for plating of connection boards, a multi-layer wiring board could be produced. Electroless nickel plating, electroless palladium plating and electroless gold plating were performed upon a connection board at an outermost layer and electroless tin plating was performed for inner connection boards and thus a multi-layer wiring board was produced as described above. Conductive connection of the multi-layer wiring board by alloy of gold and tin or tin and tin was confirmed. When an insulating resin layer was formed of 75 μm of single layer, it was confirmed that a wiring of the outermost layer might be transferred among insulating resin. If the wiring is embedded into the insulating resin and transferred, the insulating resin layer may be formed of one layer.

Example 3

Figure 6:
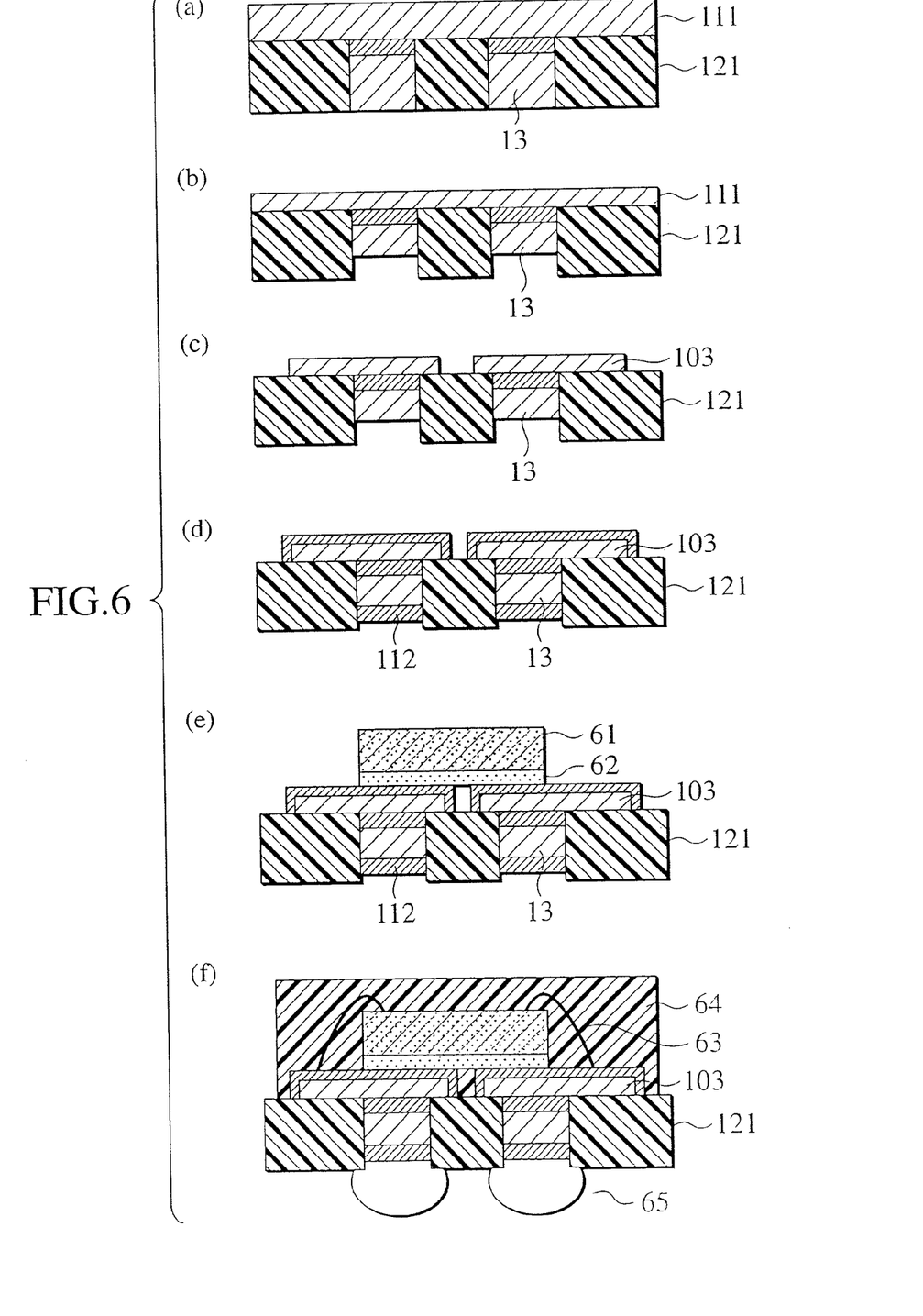
FIG. 6 is a cross-sectional view showing an embodiment of step for manufacturing a substrate for semiconductor package and a semiconductor package from the connection board of the present invention.

A substrate for semiconductor package and a semiconductor package were produced by using the connection board of FIG. 4(f) obtained in Example 1. Firstly, in order to form a fine circuit on a metallic layer 111 by etching, half etching for reducing a thickness of the metallic layer 111 to 18 μm was performed by spraying an etchant, prepared in such a manner that 100 g/L of aqueous hydrogen peroxide solution, sulfic acid and copper sulfate were mixed with each other and a resultant solution was adjusted so as to obtain 30 g/L of density of copper, on both sides of FIG. 6(a) at 35° C. of temperature of solution (FIG. 6(b)) At this time, since the thickness of ends of connection conductor is reduced, soldering balls are easily placed on such thinned end portions.

Then, as shown in FIG. 6(c), the conductor circuit 103 was formed by selectively removing the metallic layer 111 by etching. As shown in FIG. 6(d), electroless nickel plating, electroless palladium plating and electroless gold plating were successively performed upon a surface of the conductor and thus a substrate for semiconductor package was produced.

Next, as shown in FIG. 6(e), a semiconductor chip with an adhesive agent being applied to its rear surface was adhered to the substrate for semiconductor package and fixed thereto. Thereafter, as shown in FIG. 6(f), φ25 μm of gold wire was bonded and resin molding was performed by transfer molding. Soldering balls were connected by performing a high temperature reflow treatment under nitrogen atmosphere and thus a semiconductor package was produced.

Example 4

Experiment for Confirming Connection

Three layers of foils (copper/nickel/copper=70 μm/0.5 μm/35 μm were prepared.

Figure 7:
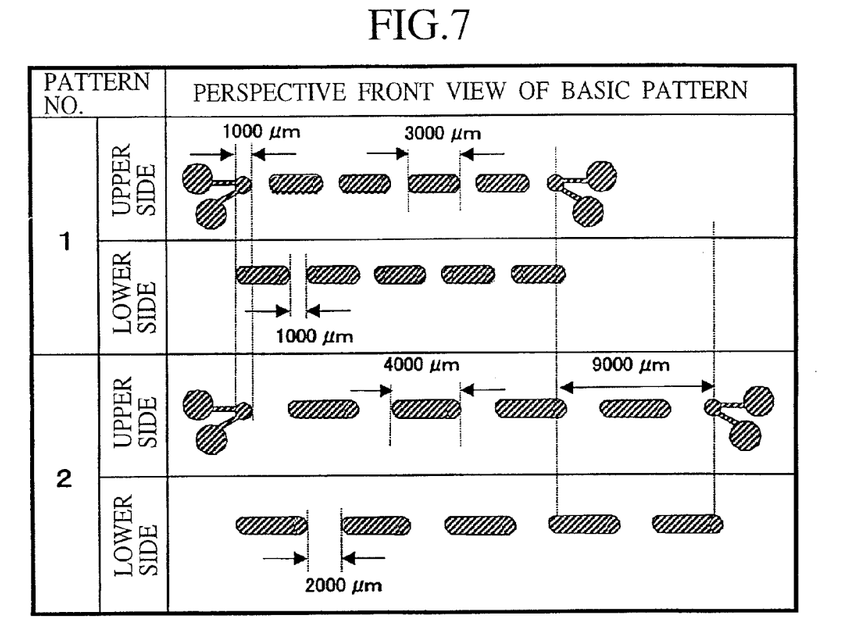
FIG. 7 is a view of specification of patterns for measuring connection resistance used in Example 4 of the present invention.

Etching was performed for 70 μm of copper foil and two different types of upper and lower patterns were formed as shown in FIG. 7.

The pattern was transferred to 100 μm of LCP (Liquid Crystal Polymer) such that the side of 70 μm of copper foil opposes the side of LCP and then 35 μm of copper foil was entirely etched. Further, 0.5 μm of nickel foil was entirely etched, and then electroless nickel plating and electroless gold plating were successively performed for an exposed pattern surface of 70 μm of copper foil. In this way, a connection board was obtained (FIG. 8(a)). A plated layer 22 had 5 μm of nickel and 0.5 μm of gold.

Figure 8:
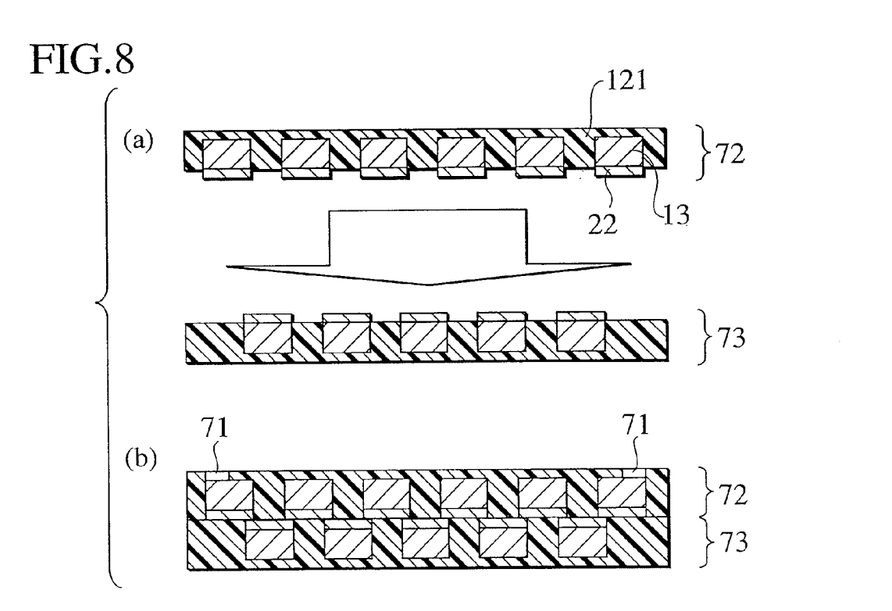

A connection board 72 formed of upper side pattern was aligned with a connection board 73 formed of lower side patter and these boards were pressed at 330° C. and 4 MPa for 5 minutes (FIG. 8(b)).

Terminal portions of ends of the upper pattern were taken out and connection resistances of four terminals between patterns were measured. Measurement was performed with n=3, an average value was calculated and a connection resistance one contact was calculated as follows.

The connection resistance was calculated such that a wiring resistance of unit length was calculated from a difference (9 mm) of pattern length between pattern No. 1 and pattern No. 2. Assume that the portion that the upper side pattern did not contact the lower side pattern (9 mm in a case of pattern No. 1 and 18 mm in a case of pattern No. 2) contributed only to the wiring resistance and portions that the upper side pattern contacted the lower side pattern (ten portions each of which has an area of 1 mmφ) contributed only to the connection resistance.

$$\text{connection resistance per contact} = (A - B \times C)/D$$

wherein A represents a measured value of connection resistance between patterns; B represents a wiring resistance per unit length; C represents a length of wiring of portion that the upper side pattern does not contact the lower side pattern and D represents the number of contacts of the upper side pattern and the lower side pattern. By the value, the connection resistance per terminal was calculated.

Figure 9:
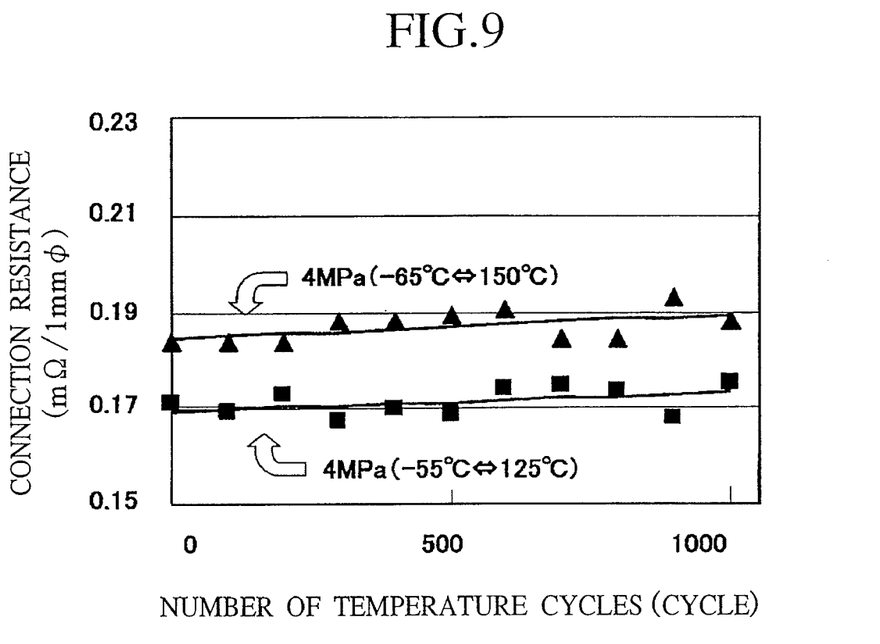
FIG. 9 is a graph showing result of test for connection resistance reliability evaluated in Example 4 of the present invention.

A TCT (Thermal Cycle Test) was performed for a produced test piece. Two types of conditions, i.e., −55° C. and 15 minutes to 125° C. 15 minutes and −65° C. and 15 minutes to 150° C. 15 minutes were used. The test was performed for each condition for 1000 cycles. As a result, as shown in FIG. 9, after 1000 cycles, 0.2 mΩ or less of connection resistance was obtained and thus high connection reliability was accomplished.

According to the present invention, a connection board that 1) inter-layer connection can be performed only at required portions without performing a step of drilling, 2) a strong filled via structure can be formed, 3) a fine wiring circuit with excellent connection reliability can be formed, 4) excellent mechanical and thermal precision can be provided and 5) a plurality of layers can be formed by lamination at a time, and a multi-layer wiring board, a substrate for semiconductor package and a semiconductor package using the connection board, and manufacturing methods thereof can be provided.

Those skilled in the art will recognize that the above described is a preferable embodiment of the present invention and many changes and modifications can be made without departing from the spirit and scope of the invention.

What is claimed is:

1. A manufacturing method of a multi-layer wiring board, comprising steps (a) to (c):
   (a) preparing at least two connection boards by a method including the steps of (a1) to (a6), said connection boards having respectively an insulating resin composition layer, a connection conductor formed so as to pass through the insulating resin composition layer and a conductor circuit formed on the insulating resin composition layer and connected to the connection conductor;
   (a1) preparing a composite metallic layer having three layers, the composite metallic layer being formed of a first metallic layer including copper, a second metallic layer including copper, and a third metallic layer including nickel or its alloy which is disposed between the first metallic layer and the second metallic layer;
   (a2) selectively removing the first metallic layer and the third metallic layer from the composite metallic layer respectively to form the connection conductor on the second metallic layer;
   (a3) performing a roughening treatment for a surface of the connection conductor and the second metallic layer having the connection conductor thereon, and then covering the surface with the insulating resin composition layer, the insulating resin composition layer having at least one layer and being formed of an insulating resin composition;

(a4) polishing a surface of the insulating resin composition layer to form a surface of the connection conductor exposed from the insulating resin composition layer;

(a5) selectively removing the second metallic layer to form the conductor circuit; and then (a6) covering the surface of the connection conductor and the surface of the conductor circuit with a metal film respectively;

(b) aligning the at least two of the connection boards obtained from the step (a) so as to provide aligned connection boards, and so as to join the connection conductors, or the connection conductor and the conductor circuit, via the metal film; and (c) laminating the aligned connection boards at a time by heating and pressing, so that the connection conductors, or the connection conductor and the conductor circuit are made into an alloy by solid phase metallic diffusion or melt bonding and conductively connected with each other, and the connection boards are mechanically connected with each other by the insulating resin composition layer.

2. The manufacturing method of a multi-layer wiring board according to claim 1, wherein a thickness of the first metallic layer is in a range of 5 to 100 μm, a thickness of the second metallic layer is in a range of 5 to 100 μm, and a thickness of the third metallic layer is in a range of 0.05 to 5 μm.

3. The manufacturing method of a multi-layer wiring board according to claim 1, wherein the insulating resin composition layer has a modulus of elasticity that is equal to or larger than 0.0001 GPa at the heating in the step (c).

4. The manufacturing method of a multi-layer wiring board according to claim 1, wherein the metal film is formed by a method of: performing electroless copper plating subsequent to application of palladium; copper sputtering or copper sputtering with chromium being a base; printing of silver paste; substitution or electroless gold plating; electrolytic or electroless plating of nickel/gold; electrolytic or electroless plating of nickel/palladium/gold; or electrolytic or electroless plating of tin or tin alloy.

5. The manufacturing method of a multi-layer wiring board according to claim 1, wherein the metal film for covering the surface of the connection conductor in the step (a6) is formed by performing (i) electroless nickel plating and then (ii) electroless gold plating, and the metal film has a thickness of 5 μm of a nickel layer and 0.5 μm of a gold layer.

6. The manufacturing method of a multi-layer wiring board according to claim 1, wherein two of the second metallic layers having the connection conductor from the step (a2) are positioned on both sides of a supporting substrate, the supporting substrate having a larger area than those of the second metallic layers, further the step (a3) is performed to form two of the insulating resin composition layers, and then a polishing treatment to the two insulating resin composition layers in the step (a4) is performed at a same time.

* * * * *